United States Patent [19]
Sakai

[11] Patent Number: 5,214,290
[45] Date of Patent: May 25, 1993

[54] ELECTRON BEAM LITHOGRAPHY AND WORKPIECE SUPPORTING APPARATUS HAVING SUPPORTING MEANS FOR WORKPIECE STAGE AND MOVING MEANS DETACHABLY MOUNTED TO COVER OPENING IN VACUUM CHAMBER

[75] Inventor: Hiroyuki Sakai, Ibaraki, Japan

[73] Assignee: Hitachi, Ltd., Chiyoda, Japan

[21] Appl. No.: 788,318

[22] Filed: Nov. 5, 1992

[30] Foreign Application Priority Data

Nov. 5, 1990 [JP] Japan ................... 2-297313

[51] Int. Cl.$^5$ ............................................. H01J 37/20
[52] U.S. Cl. .................. 250/492.2; 250/400; 250/441.11; 250/442.11
[58] Field of Search ............. 250/400, 491.1, 492.2 R, 250/442.1, 441.1; 269/50, 51, 903, 908

[56] References Cited

U.S. PATENT DOCUMENTS

| Re. 31,630 | 7/1984 | Goto et al. | 250/400 |
|---|---|---|---|
| 2,860,251 | 11/1958 | Pakswer et al. | 250/400 |
| 3,638,015 | 1/1972 | Browning et al. | 250/442.11 |
| 4,718,019 | 1/1988 | Filliou et al. | 250/491.1 |

FOREIGN PATENT DOCUMENTS 1-125932  5/1989  Japan ................... 250/400

Primary Examiner—Jack I. Berman
Assistant Examiner—Jim Beyer
Attorney, Agent, or Firm—Antonelli, Terry, Stout & Kraus

[57] ABSTRACT

Disclosed is an electron beam lithography apparatus comprising means for emitting an electron beam and directing it toward and onto a workpiece, means for deflecting and turning on-off the electron beam so as to form a predetermined pattern on the workpiece, a vacuum column disposed to expose the electron beam to a vacuum, a workpiece stage including a first table supporting the workpiece and a second table supporting the first table, means for moving the first table in one of the X-axis and Y-axis directions and moving the second table in the other direction, a vacuum workpiece chamber disposed to make vacuum communication with the vacuum column and to accommodate both of the workpiece and the workpiece stage, and means for supporting both of the workpiece stage and the workpiece moving means, the vacuum workpiece chamber being partly opened, and the supporting means being detachably mounted on the opening of the vacuum workpiece chamber.

14 Claims, 5 Drawing Sheets

ELECTRON BEAM LITHOGRAPHY AND WORKPIECE SUPPORTING APPARATUS HAVING SUPPORTING MEANS FOR WORKPIECE STAGE AND MOVING MEANS DETACHABLY MOUNTED TO COVER OPENING IN VACUUM CHAMBER

BACKGROUND OF THE INVENTION

This invention relates to an electron beam lithography apparatus used for manufacturing semiconductor devices.

In an electron beam lithography apparatus, a device is required for moving a workpiece in both the X-axis and Y-axis directions so as to form a predetermined pattern on the workpiece. Such a device is described in, for example, JP-A-52-6084.

It is actually necessary that, for purposes of so-called maintenance including cleaning and lubrication, the device used for moving a workpiece in both the X-axis and Y-axis directions is to be taken out at least once a year from a vacuum workpiece chamber through a workpiece withdrawal window and, after the maintenance, mounted again in the workpiece chamber.

However, in a conventional electron beam lithography apparatus as described above, special considerations have not been paid to the facilitation of the maintenance and also to the easy reproduction of the operational accuracy of the apparatus at the time of reassembling after the maintenance work.

SUMMARY OF THE INVENTION

It is an object of the present invention to provide an electron beam lithography apparatus which can attain the desired purposes of facilitating the maintenance and making substantially unnecessary to readjust the operational accuracy of the apparatus at the time of re-assembling after the maintenance work.

The present invention provides an electron beam lithography apparatus comprising means for emitting an electron beam and directing it toward and onto a workpiece, means for deflecting and turning on-off the electron beam so as to form a predetermined pattern on the workpiece, a vacuum column disposed to expose the electron beam to a vacuum, a workpiece stage including a first table supporting the workpiece and a second table supporting the first table, means for moving the first table in one of the X-axis and Y-axis directions and moving the second table in the other direction, a vacuum workpiece chamber disposed to make vacuum communication with the vacuum column and to accommodate both of the workpiece and the workpiece stage, and means for supporting both of the workpiece stage and the workpiece moving means, the vacuum workpiece chamber being partly opened, and the supporting means being detachably mounted on the opening of the vacuum workpiece chamber.

In such an electron beam lithography apparatus according to the present invention, both of the workpiece stage and the workpiece moving means are supported by the supporting means, and this supporting means is detachably mounted on the opening of the vacuum workpiece chamber. Therefore, when the workpiece stage is taken out of the vacuum workpiece chamber for the purpose of the maintenance and is then placed in the workpiece chamber again, the workpiece moving means is also taken out and placed again in the vacuum workpiece chamber together with the workpiece stage. Thus, the maintenance work is facilitated, and the readjustment of the operational accuracy of the apparatus becomes substantially unnecessary.

DESCRIPTION OF THE PREFERRED EMBODIMENTS

A preferred embodiment of the electron beam lithography apparatus according to the present invention will now be described by reference to FIGS. 1, 2, 3 and 4.

Figure 2:
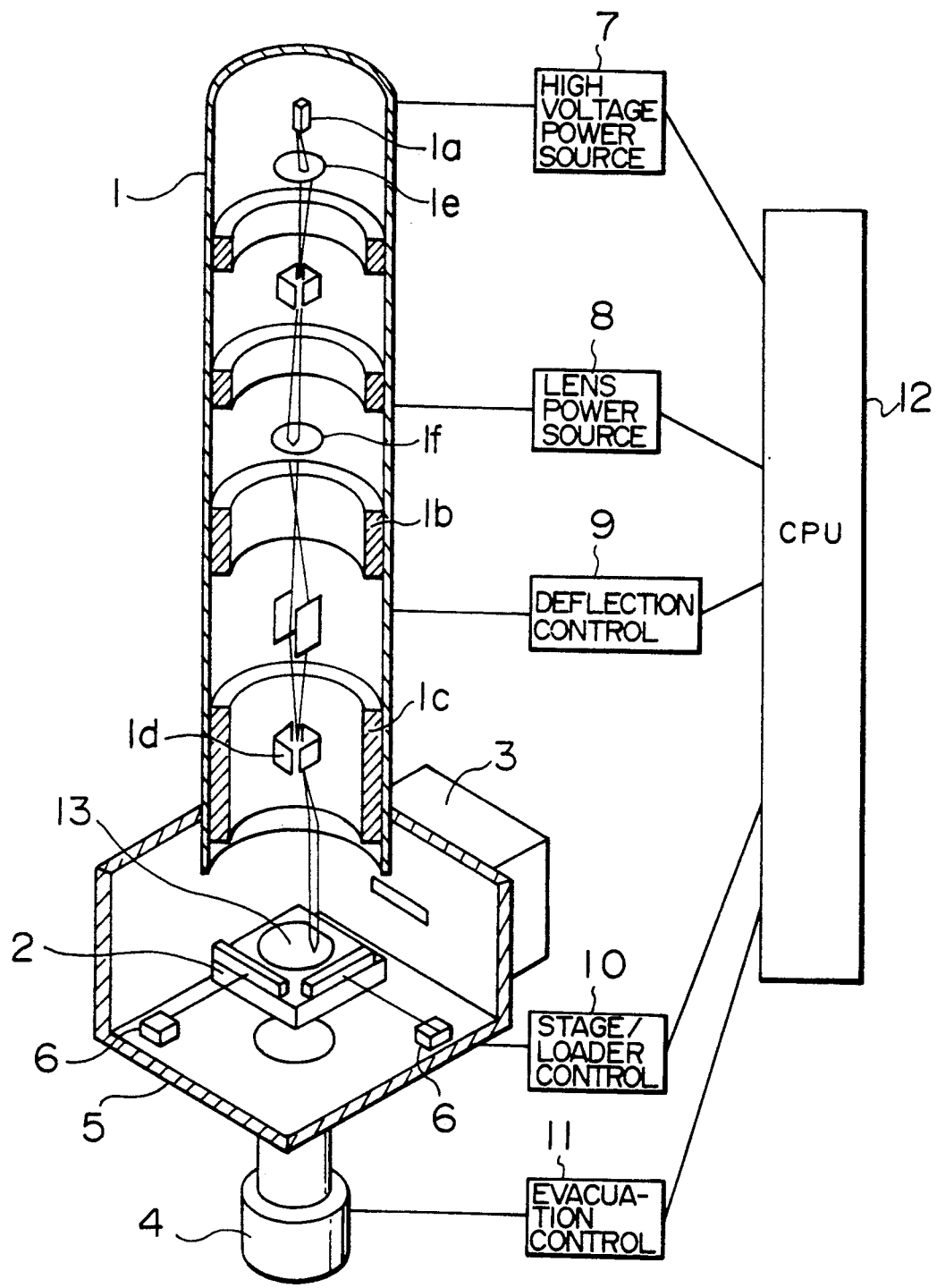
FIG. 2 is a diagrammatic view of the electron beam lithography apparatus of the present invention shown in FIG. 1.

FIG. 2 diagrammatically shows the general structure of the apparatus. Referring to FIG. 2, an electron beam emitted from an electron gun 1a is formed into a desired shape by diaphragms 1e and 1f and is the directed toward and onto a workpiece 13 on a workpiece stage 2 by the combination of a demagnifying lens 1b and an objective lens 1c. A vacuum column 1 is disposed so as to expose the electron beam to a vacuum. The position where the workpiece 13 is irradiated with the electron beam is determined by the combination of the workpiece stage 2 and a deflector 1d, and the accurate position of the workpiece stage 2 is measured by a laser interferometer system 6. The electron lenses and the deflector are located in the vacuum column 1, while the workpiece stage 2 is located in a vacuum workpiece chamber 5. A workpiece exchanger (a loader) 3 is located adjacent to the vacuum workpiece chamber 5. All of the vacuum vessels are evacuated to a very high vacuum by an evacuating device 4.

The individual components described above are connected to a high-voltage power source 7, a lens power source 8, a deflection control system 9, a stage/loader control system 10 and an evacuation control system 11, all of which are under control of a CPU 12. The lithography, that is, the formation of the desired pattern on the workpiece 13, is effected by the deflection and on-off control of the electron beam, and, in the course of the lithography, the size of the electron beam is also controlled. Of course, the above control is executed by the CPU 12.

Figure 1:
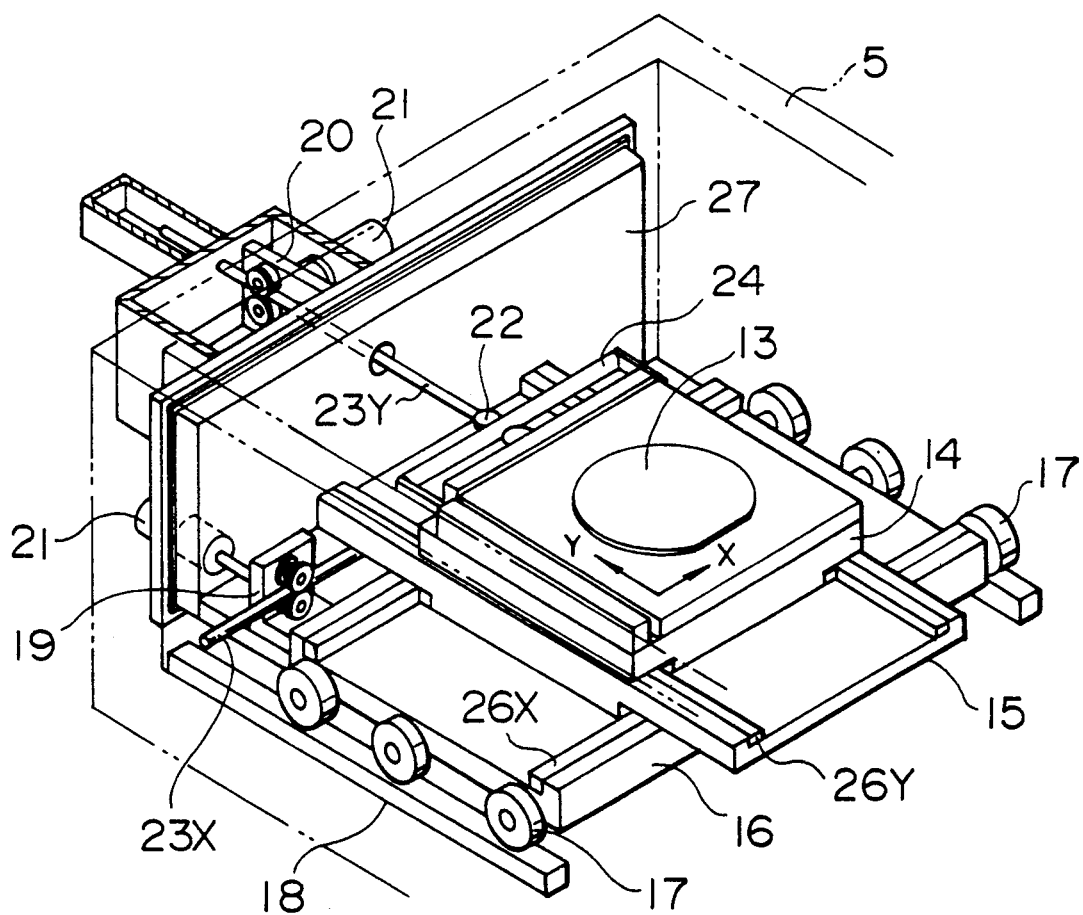
FIG. 1 is a perspective view of a workpiece stage in an embodiment of the electron beam lithography apparatus according to the present invention.

FIG. 1 shows the details of the workpiece stage 2 and associated parts. The workpiece stage 2 includes an X table 15 and a Y table (a top table) 14, which are supported by a base 16.

When the workpiece 13 is to be moved in the X-axis direction, both of the X table 15 and the Y table 14 are integrally moved in the X-axis direction by being guided by cross roller guides 26X. On the other hand, when the Y table 14 is to be moved in the Y-axis direction, the Y table 14 only is moved in the Y-axis direction by being guided by cross roller guides 26Y. Of course, the workpiece 13 can be moved in both the X-axis and Y-axis directions at the same time.

A driver rod 23X fixed at one end to the X table 15 is moved along a rectilinear path by an X-axis driver mechanism 19 when it is desired to move the workpiece 13 in the X-axis direction. This X-axis driver mechanism 19 is fixed to the base 16. The base 16 is fixed to a side wall 27.

Another driver rod 23Y coupled by a coupler 22 to the Y table 14 is moved along a rectilinear path by a Y-axis driver mechanism 20 when it is desired to move the workpiece, 13 in the Y-axis direction. This Y-axis driver mechanism 20 is fixed also to the side wall 27. The vacuum workpiece chamber 5 is partly opened, and the side wall 27 is detachably mounted in vacuum-tight relation on the opened part or opening of the vacuum workpiece chamber 5. The side wall 27 forms a supporting member in the form of a cover.

Figure 3:
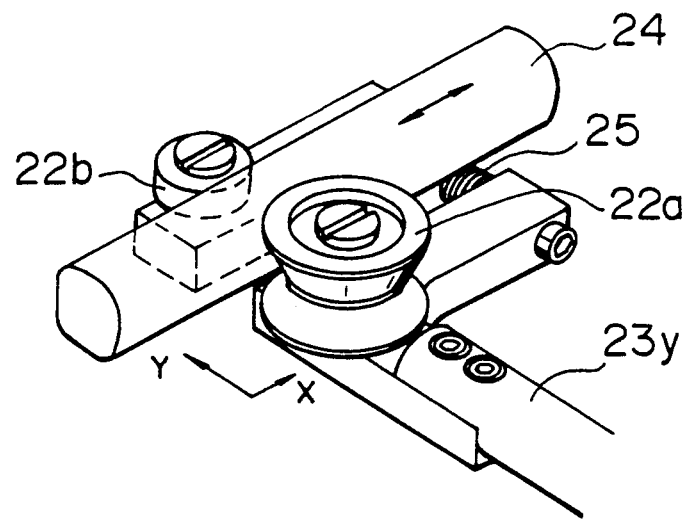
FIG. 3 is an enlarged perspective view showing in detail the structure of the coupler shown in FIG. 1.

When the workpiece 13 is moved in the X-axis direction, the Y table 14 must make a smooth movement in the X-axis direction without moving in the Y-axis direction. FIG. 3 shows in detail the structure of the coupler 22 which ensures the above movement of the Y table 14. A guide bar 24 is fixed to the Y table 14 in parallel to the cross roller guides 26X which are the X-axis direction guide members. This guide bar 24 is columnar in shape, and one of its sides is shaped into the form of a planar surface. The guide bar 24 is held between a pre-loaded bearing 22b and a V-grooved pulley 22a. The pre-load is imparted by a coil spring 25. Because of the provision of the coupler 22 having such a structure, the Y table 14 can be smoothly moved in the X-axis direction. Further, the V-grooved pulley 22a acts to prevent vertical displacement of the driver rod 23Y.

Figure 4:
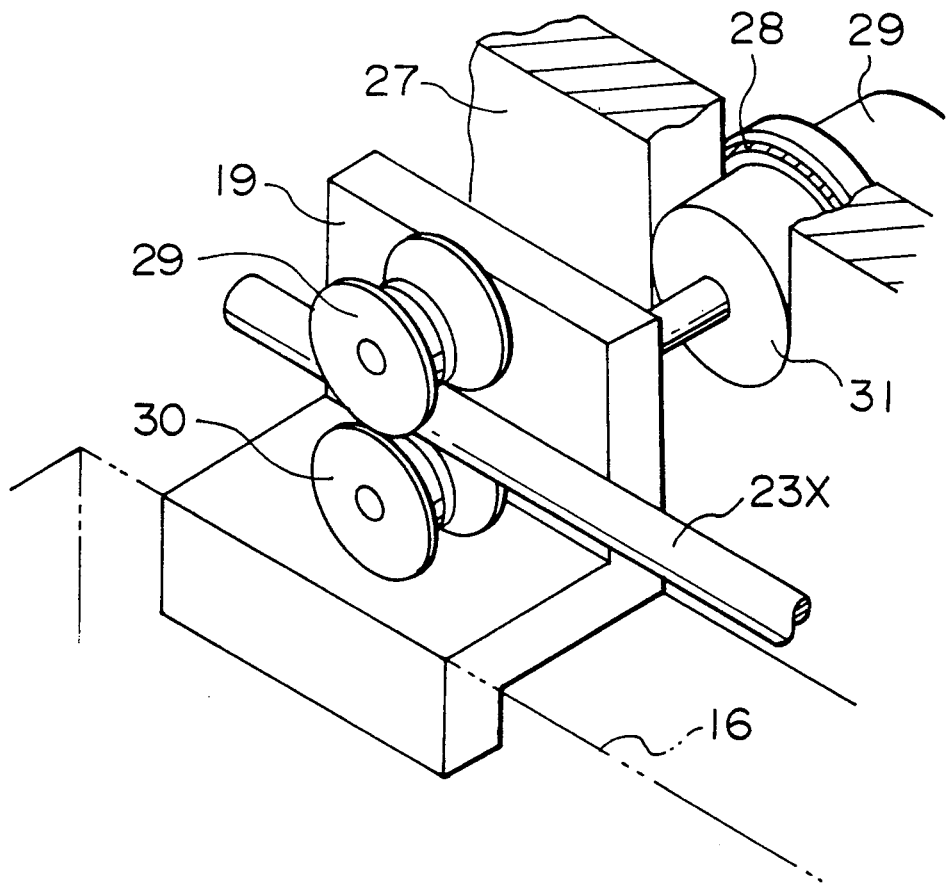
FIG. 4 is an enlarged perspective view showing in detail the structure of the X-axis driver mechanism shown in FIG. 1.

FIG. 4 shows in detail the structure of the X-axis driver mechanism 19. Referring to FIG. 4, the driver rod 23X is held with a predetermined load between a V-grooved pulley 29 and a V-grooved roller 30 coupled to a motor 21. This motor 21 is fixed to the side wall 27 of the vacuum workpiece chamber 5 and is isolated from the vacuum side by a packing 28 and a magnetohydrodynamic seal 31. The X-axis driver mechanism 19 is fixed to the base 16, and the base 16 is fixed to the side wall 27.

As described above, the base 16 and the driver mechanisms 19, 20 are all mounted on one side wall 27 of the vacuum workpiece chamber 5, and rollers 17 mounted on the base 16 are arranged to roll on withdrawal guide rails 18 fixed to the bottom plate of the vacuum workpiece chamber 5, so that the entire workpiece stage 2 can be taken out from the workpiece chamber 5 together with the driver mechanisms 19 and 20.

Figure 6:
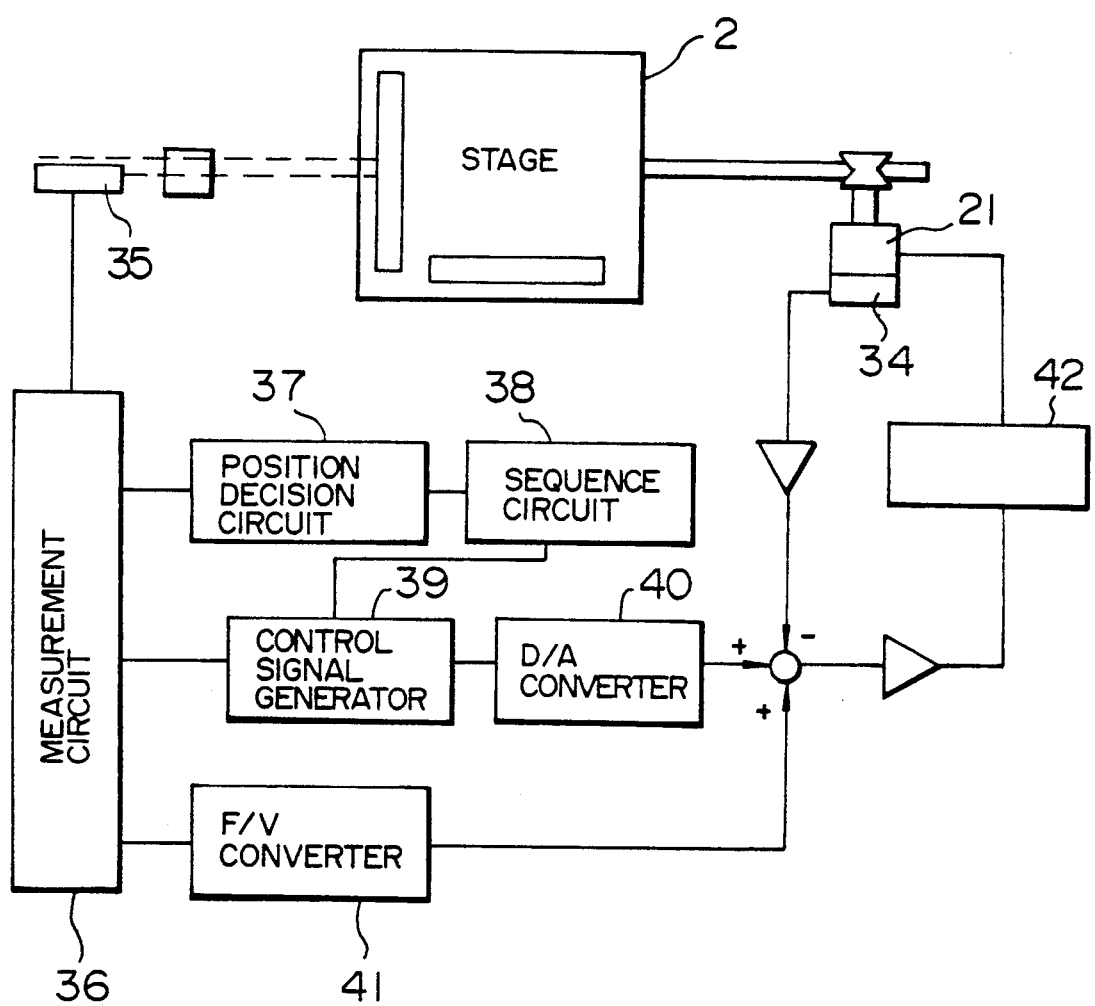
FIG. 6 is a block diagram of a control system used in the embodiment shown in FIG. 1.

FIG. 6 is a block diagram showing how to control the movement of the workpiece stage 2 in the embodiment shown in FIG. 1. Referring to FIG. 6, the laser signals received by a receiver 35 are supplied to a measurement circuit 36. One of the output signals of the measurement circuit 36 is supplied through a position decision circuit 37 and a sequence circuit 38 to a control signal generator circuit 39, where the signal and the preceding signal supplied from the measurement circuit 36 are based to produce a control signal. The control signal is converted into an analog signal by a D/A converter 40 to be supplied to the motor 21 after being amplified by a power amplifier 42. On the other hand, another output signal from the measurement circuit 36 is converted into a stage velocity signal by an F/V converter 41 to be added to the control signal so as to prevent oscillation of the stage 2. A tachogenerator 34 measures the rotation speed of the motor 21, and the measured motor rotation speed signal is fed back to the control signal so that the rotation speed of the motor can be maintained stable. The desired stable control of the stage 2 can be ensured by the control circuit described above.

Figure 5:
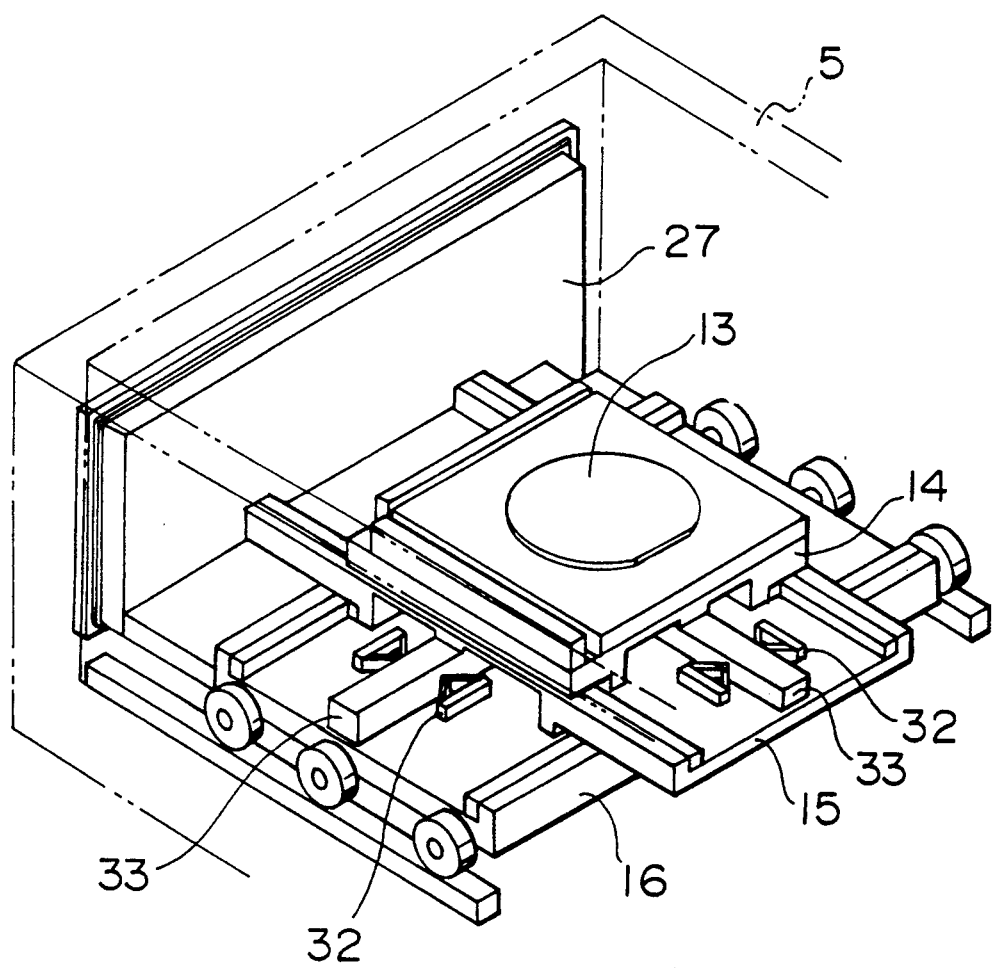
FIG. 5 is a perspective view similar to FIG. 1 to show another embodiment of the present invention.

In a modification shown in FIG. 5, a guide rail 33 is provided on the Y table 14, and an ultrasonic motor 32 formed of a non-magnetic material is mounted on the X table 15. Similarly, a guide rail 33' is provided on the X table 15, and another ultrasonic motor 32' is mounted on the base 16. Although the ultrasonic motor 32 mounted on the X table 15 moves together with the X table 15 with the movement of the X table 15, any magnetic field derangement adversely affecting the electron beam is not caused. Provision of the side wall 27 fixed to the base 16 in the embodiment shown in FIG. 5 exhibits the effect similar to that of the embodiment shown in FIG. 1. Unlike the arrangement shown in FIG. 5, the ultrasonic motors may be mounted on the members on which the guide rails are provided, and the guide rails may be provided on the members on which the ultrasonic motors are mounted, respectively.

The aforementioned embodiments including the stage having the frictionally-driven driver mechanisms and the stage position feedback control system are advantageous in that direct lithography on wafers used to produce, for example, 64M-bit memories and fabrication of mask reticles can be easily achieved.

According to the present invention, the workpiece stage can be taken out of the vacuum workpiece chamber together with the workpiece moving means without the necessity for disassembling the vacuum column, so that the maintenance of the workpiece stage is facilitated.

Further, both the workpiece stage and the workpiece moving means can be taken out without the necessity for separating the workpiece stage from the workpiece moving means. Therefore, the re-adjustment at the time of re-assembling is unnecessary, and the original operational accuracy before the stage is taken out can be maintained, so that the period of time required for the maintenance work can be greatly shortened.

I claim:

1. An electron beam lithography apparatus comprising means for emitting an electron beam and directing it toward and onto a workpiece, means for deflecting and turning on-off said electron beam so as to form a predetermined pattern on said workpiece, a vacuum column disposed to expose said electron beam to a vacuum, a workpiece stage including a first table supporting said workpiece and a second table supporting said first table, workpiece moving means for moving said first table in one of the X-axis and Y-axis directions and moving said second table in the other direction, a vacuum workpiece chamber disposed to make vacuum communication with said vacuum column and to accommodate both of said workpiece and said workpiece stage, and supporting means for supporting both of said workpiece stage and said workpiece moving means, said vacuum workpiece chamber having an opening, and said supporting means being detachably mounted in vacuum tight relation to cover the opening of said vacuum workpiece chamber.

2. An electron beam lithography apparatus according to claim 1, wherein said supporting means includes a supporting member supporting said second table so as to move said second table in the other of said X-axis and Y-axis directions.

3. An electron beam lithography apparatus according to claim 2, wherein guide rail means for guiding the movement of said supporting member is provided, and said supporting member is moved on said guide rail means while making rolling contact with said guide rail means.

4. An electron beam lithography apparatus according to claim 3, wherein said workpiece moving means includes a first driver shaft coupled to said first table so as to permit movement of said first table in its moving direction while inhibiting movement of said first table in a direction orthogonal to said moving direction, a first motor, and means for converting the rotation of said first motor into axial movement of said first driver shaft, and further includes a second driver shaft coupled to said second table in a relation orthogonal to said first driver shaft, a second motor, and means for converting the rotation of said second motor into axial movement of said second driver shaft.

5. An electron beam lithography apparatus according to claim 4, wherein said supporting means includes a second supporting member in the form of a cover detachably closing said opening of said workpiece chamber, and said first driver shaft and the shaft of said second motor extend through said second supporting member.

6. An electron beam lithography apparatus according to claim 2, wherein said workpiece moving means includes a first table moving means for moving said first table and separate second table moving means for moving said second table, said first table moving means including an ultrasonic motor of a non-magnetic material mounted on one of said first table and said second table, and guide rail means provided on the other of said tables so as to guide said ultrasonic motor, and said second table moving means including an ultrasonic motor of a non-magnetic material mounted on one of said second table and said supporting member, and guide rail means provided on the other of said second table and said supporting member so as to guide said ultrasonic motor.

7. A workpiece supporting apparatus comprising a workpiece stage disposed in a vacuum workpiece chamber and including a first table supporting a workpiece and a second table supporting said first table, workpiece moving means for moving said first table in one of the X-axis and Y-axis directions and moving said second table in the other direction, and supporting means for supporting both of said workpiece stage and said workpiece moving means, said vacuum workpiece chamber having an opening, and said supporting means being detachably mounted in vacuum tight relation to cover the opening of said vacuum workpiece chamber.

8. A workpiece supporting apparatus according to claim 7, wherein said supporting means includes a supporting member supporting said second tables so as to move said second table in the other of said X-axis and Y-axis directions.

9. A workpiece supporting apparatus according to claim 8, wherein guide rail means for guiding the movement of said supporting member is provided, and said supporting member is moved on said guide rail means wile making rolling contact with said guide rail means.

10. A workpiece supporting apparatus according to claim 9, wherein said workpiece moving means includes a first driver shaft coupled to said first table so as to permit movement of said first table in its moving direction while inhibiting movement of said first table in a direction orthogonal to said moving direction, a first motor, and means for converting the rotation of said first motor into axial movement of said first driver shaft, and further includes a second driver shaft coupled to said second table in a relation orthogonal to said first driver shaft, a second motor, and means for converting the rotation of said second motor into axial movement of said second driver shaft.

11. A workpiece supporting apparatus according to claim 10, wherein said supporting means includes a second supporting member in the form of a cover detachably closing said opening of said workpiece chamber, and said first driver shaft and the shaft of said second motor extend through said second supporting member.

12. A workpiece supporting apparatus according to claim 8, wherein said workpiece moving means includes a first table moving means for moving said first table and a separate second table moving means for moving said second table, said first table moving means including an ultrasonic motor of a non-magnetic material mounted on one of said first table and said second table, and guide rail means provided on the other of said tables so as to guide said ultrasonic motor, and said second table moving means including an ultrasonic motor of a non-magnetic material mounted on one of said second table and said supporting member, and guide rail means provided on the other of said second table and said supporting member so as to guide said ultrasonic motor.

13. A workpiece supporting apparatus comprising a workpiece stage disposed in a vacuum workpiece chamber and including a first table supporting a workpiece and a second table supporting said first table, workpiece moving means for moving said first table in one of the X-axis and Y-axis directions and moving said second table in the other direction, and a support for supporting both of said workpiece stage and said workpiece moving means, said vacuum workpiece chamber having an opening, and said support being detachably mounted in vacuum tight relation to cover the opening of said vacuum workpiece chamber.

14. An electron beam lithography apparatus comprising an electron gun, means for directing an electron beam from the electron gun toward and onto a workpiece, means for deflecting and turning on-off said electron beam so as to form a predetermined pattern on said workpiece, a vacuum column disposed to expose said electron beam to a vacuum, a workpiece stage including a first table supporting said workpiece and a second table supporting said first table, workpiece moving means for moving said first table in one of the X-axis and Y-axis directions and moving said second table in the other direction, a vacuum workpiece chamber disposed to make vacuum communication with said vacuum column and to accommodate both of said workpiece and said workpiece stage, and a support for supporting both of said workpiece stage and said workpiece moving means, said vacuum workpiece chamber having an opening, and said support being detachably mounted in vacuum tight relation to cover the opening of said vacuum workpiece chamber.

* * * * *